United States Patent
Huo et al.

(10) Patent No.: US 11,499,996 B2
(45) Date of Patent: *Nov. 15, 2022

(54) DEAD FRONT CONNECTOR HAVING A VOLTAGE INDICATOR

(71) Applicant: Hubbell Incorporated, Shelton, CT (US)

(72) Inventors: Xingniu Huo, Medina, OH (US); William Frederick Tyrrell, III, New Franklin, OH (US); Bastiaan Hubertus Van Besouw, Strongsville, OH (US); Jeffrey Joseph Kester, Bemus Point, NY (US); Peter James Swales, Aiken, SC (US)

(73) Assignee: Hubbell Incorporated, Shelton, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/590,827

(22) Filed: Oct. 2, 2019

(65) Prior Publication Data

US 2020/0033385 A1     Jan. 30, 2020

Related U.S. Application Data

(63) Continuation of application No. 15/230,771, filed on Aug. 8, 2016, now Pat. No. 10,451,658.

(60) Provisional application No. 62/203,483, filed on Aug. 11, 2015.

(51) Int. Cl.
*G01R 19/165* (2006.01)
*G01R 19/155* (2006.01)
*G01R 15/16* (2006.01)

(52) U.S. Cl.
CPC ......... *G01R 19/155* (2013.01); *G01R 19/165* (2013.01); *G01R 19/16523* (2013.01); *G01R 15/16* (2013.01)

(58) Field of Classification Search
CPC ................ G01R 19/155; G01R 19/165; G01R 19/16523
See application file for complete search history.

(56) References Cited

U.S. PATENT DOCUMENTS

| | | |
|---|---|---|
| 4,152,643 A | 5/1979 | Schweitzer |
| 4,714,916 A | 12/1987 | Schweitzer, Jr. |
| 4,904,932 A | 2/1990 | Schweitzer, Jr. |
| 5,034,728 A | 7/1991 | Taylor |
| 5,274,324 A | 12/1993 | Schweitzer |
| 6,949,921 B1 | 9/2005 | Feight et al. |
| 7,503,785 B2 * | 3/2009 | Stepniak ............... H01R 13/53 439/187 |

(Continued)

OTHER PUBLICATIONS

PCT/US2016/045979 International Search Report and Written Opinion dated Dec. 30, 2016 (16 pages).

*Primary Examiner* — Reena Aurora
(74) *Attorney, Agent, or Firm* — Michael Best & Friedrich LLP

(57) ABSTRACT

A dead front connector including a housing, an electrical coupling configured to electrically connect a power cable to a device, and an indicator located on the housing. The dead front connector further including a voltage testing circuit configured to test a voltage between the power cable and the device and illuminate the indicator when the voltage is above a predetermined threshold.

10 Claims, 6 Drawing Sheets

(56) References Cited

U.S. PATENT DOCUMENTS 10,451,658 B2 * 10/2019 Huo ................ G01R 19/16523
2007/0086140 A1    4/2007 Swartzendruber et al.

* cited by examiner

DEAD FRONT CONNECTOR HAVING A VOLTAGE INDICATOR

RELATED APPLICATIONS

The present application claims priority to U.S. patent application Ser. No. 15/230,771, filed Aug. 8, 2016, which claims priority to U.S. Provisional Application No. 62/203,483, filed Aug. 11, 2015, the entire contents of both of which are hereby incorporated.

BACKGROUND

The application relates to insulated electrical connectors.

SUMMARY

Insulated connectors, or more specifically, dead front connectors are typically used in underground electrical distribution system to connect underground power cables.

In one embodiment, the application provides a dead front connector including a housing, an electrical coupling configured to electrically connect a power cable to a device, and an indicator located on the housing. The dead front connector further including a voltage testing circuit configured to test a voltage between the power cable and the device and illuminate the indicator when the voltage is above a predetermined threshold.

Other aspects of the application will become apparent by consideration of the detailed description and accompanying drawings.

DETAILED DESCRIPTION

Before any embodiments of the application are explained in detail, it is to be understood that the application, and the devices and method described herein, are not limited in their application to the details of construction and the arrangement of components set forth in the following description or illustrated in the following drawings. The devices and methods in this application are capable of other embodiments and of being practiced or of being carried out in various ways.

Figure 1:
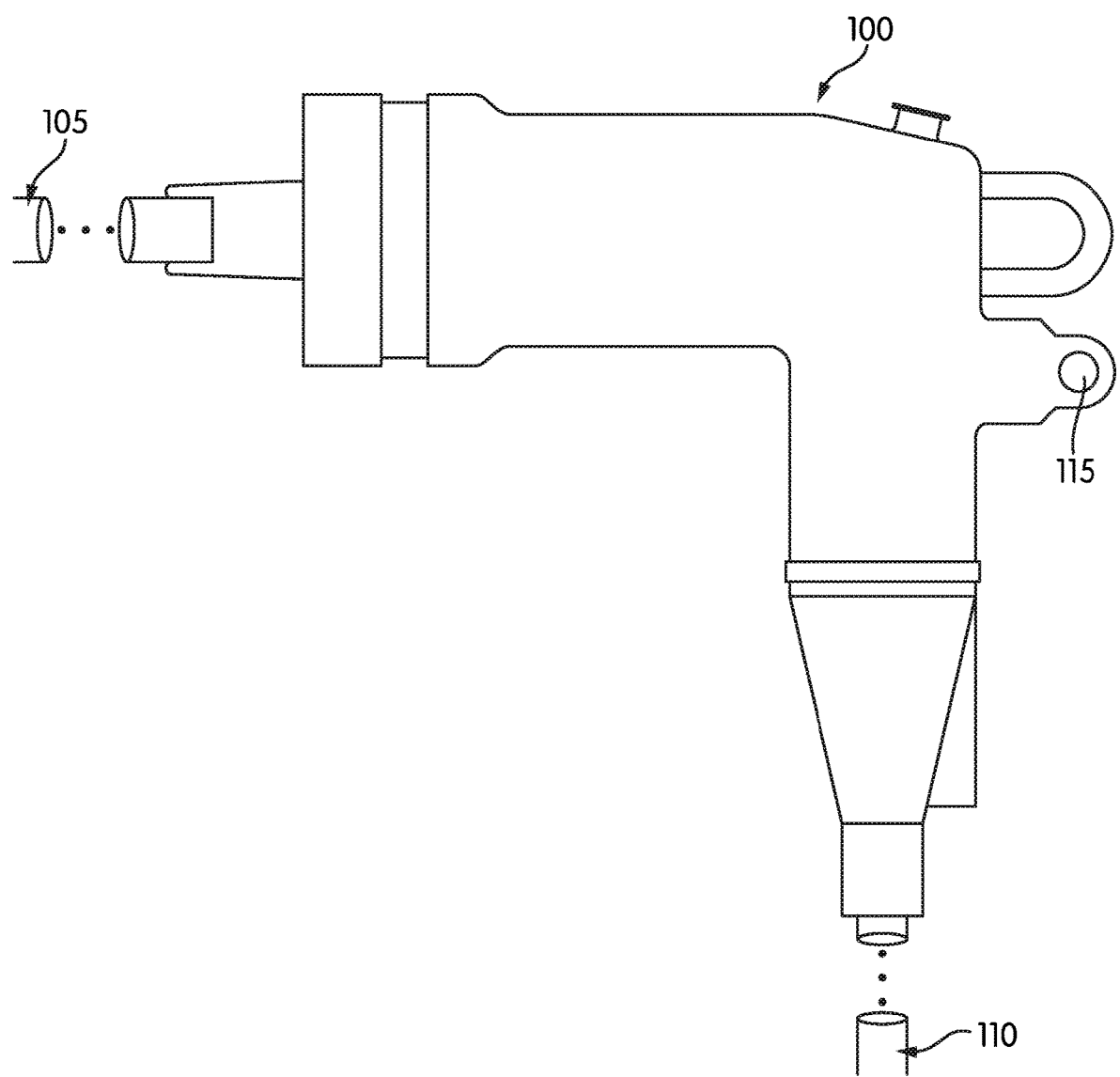
FIG. 1 illustrates a side view of a connector according some embodiments of the application.

FIG. 1 illustrates a side view of a connector 100 according some embodiments of the application. The connector 100 is configured to electrically connect a power cable 105 to a device 110. The connector 100 is further configured to allow a flow of electricity between the power cable 105 and the device 110. The connector 100 may include an indicator 115.

As discussed in further detail below, the indicator 115 is configured to provide an indication to a user when a voltage is present, and/or when a voltage is not present, at the connection between the power cable 105 and the device 110. Although illustrated as an elbow connector, in other embodiments, connector 100 may be a substantially straight connector.

Figure 2:
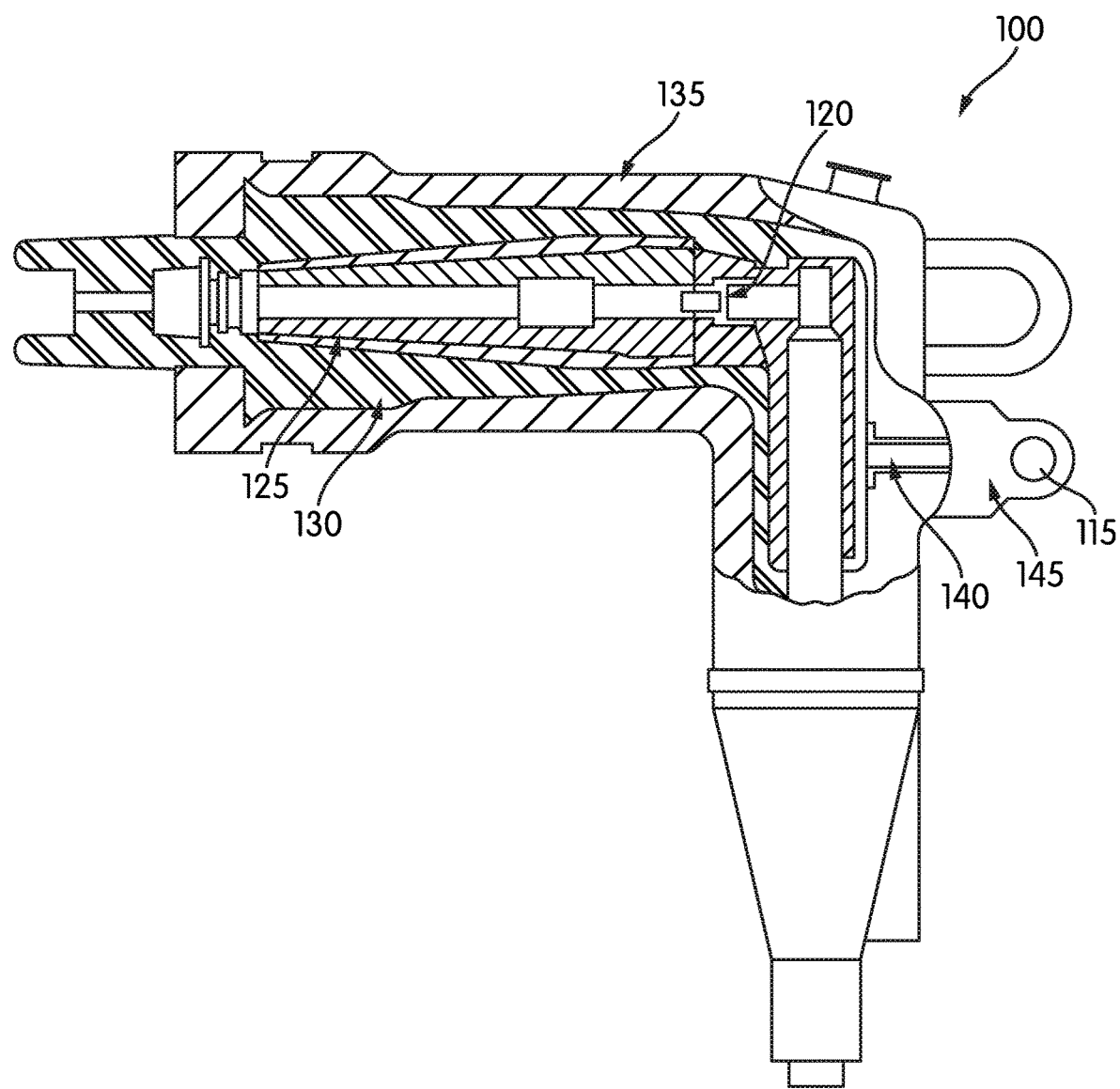
FIG. 2 illustrates a partial cutaway view of the connector of FIG. 1 according some embodiments of the application.

FIG. 2 illustrates a partial cutaway view of the connector 100. The connector 100 additionally may include an electrical coupling 120, an insulation layer 125, a conductive shield 130, a grounded shield 135, a voltage tap 140, and a voltage testing circuit, or testing circuit, 145.

The electrical coupling 120 electrically couples the power cable 105 to the device 110. The electrical coupling 120 is electrically shielded, or isolated, from the rest of the connector 100 via the insulation layer 125. The conductive shield 130 prevents electromagnetic interference (EMI) or radio frequency interference (RFI) from affecting the electrical connection between the power cable 105 and the device 110. The grounded shield 135 is configured to keep an outside surface 150 of the connector 100 at ground potential, thus providing a "dead front" for the safety of a user or others who come into contact with the connector 100. In some embodiments, the grounded shield 135 is constructed of semiconductive ethylene propylene diene M-class (EPDM) rubber. In other embodiments, the grounded shield 135 may be constructed of thermal plastic rubber (TPR), thermal plastic elastomer (TPE), silicone rubber, epoxy, or the like. The voltage tap 140 allows testing for the presence of a voltage the electrical connection (e.g., the electrical coupling 120) between the power cable 105 and the device 110. In some embodiments, the voltage tap 140 is a capacitive voltage tap. The presence of voltage at the electric coupling 120 may be detected using the testing circuit 145. The presence of voltage may then be indicated to a user via the indicator 115. In some embodiments, the testing circuit 145 is selectively removable from the voltage tap 140 and thus the connector 100. In other embodiments, the testing circuit 145 is permanently affixed within the voltage tap 140.

Figure 3:
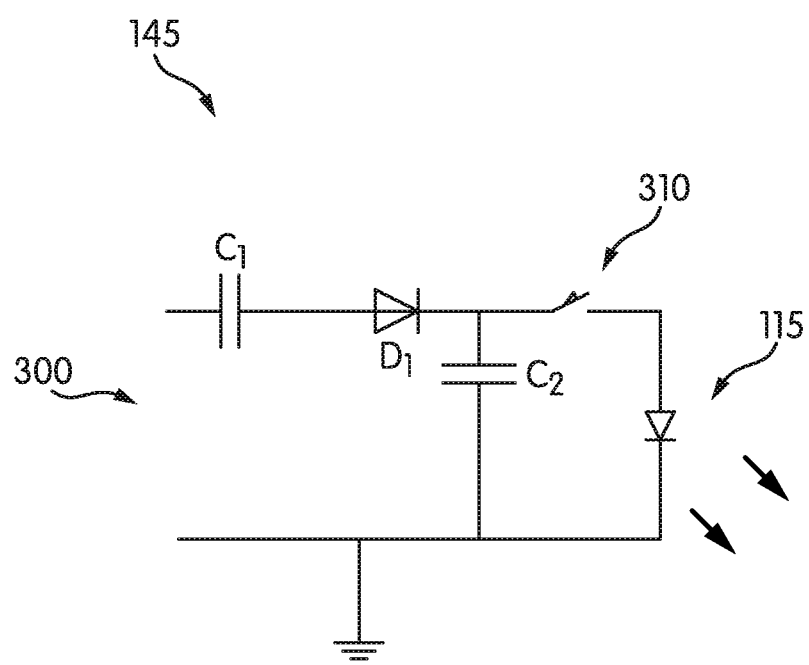
FIG. 3 is a circuit diagram illustrating a testing circuit to be used in accordance with the connector of FIG. 1, according to one embodiment of the application.

FIG. 3 is a circuit diagram illustrating the testing circuit 145 according to one embodiment of the application. The testing circuit 145 may include a test input 300 for receiving voltage from the electrical connection between the power cable 105 and the device 110. The test input 300 is in an electrical series-type connection with a capacitor C1. In some embodiments, capacitor C1 has a capacitance of approximately 2500 pF to approximately 3500 pF and a power rating of approximately 0.5 kV to approximately 1.5 kV. Capacitor C1 is in an electrical series-type connection with a diode D1. In some embodiments, diode D1 acts as a half-wave rectifier. Diode D1 is in an electrical parallel-type connection with capacitor C2. In some embodiments, capacitor C2 has a capacitance of approximately 5 μF to approximately 15 μF and a power rating of approximately 45V to approximately 55V. Diode D1 is further in an electrical series-type connection with a gap switch, or flashover switch, 310. In some embodiments, the gap switch 310 switches between an open state and a closed state dependent on a capacitor voltage level of capacitor C2. For example, gap switch 310 may switch from an open state to a closed state once the voltage level of capacitor C2 reaches a predetermined threshold. In some embodiments, the predetermined threshold is approximately 40V. In other embodiments, the predetermined threshold may be less than or greater than 40V. The gap switch 310 is in an electrical series-type connection with indicator 115. In some embodiments, the indicator 115 is one or more light-emitting diodes (LEDs).

In operation, when there is an electrical connection between the power cable 105 and the device 110, a voltage is present at the test input 300. The voltage charges capacitors C1 and C2. When a voltage of capacitor C2 reaches a predetermined threshold (e.g., approximately 40V), the gap switch 310 closes. When the gap switch 310 closes, the capacitor voltage stored in capacitor C2 is released to the indicator 115, thus draining the capacitor C2. The gap switch 310 then opens once the capacitor voltage of capacitor C2 drops below the predetermined threshold. While a voltage is present at the test input 300, the operation is continually repeated, thus causing a blinking effect on the indicator 115.

Figure 4:
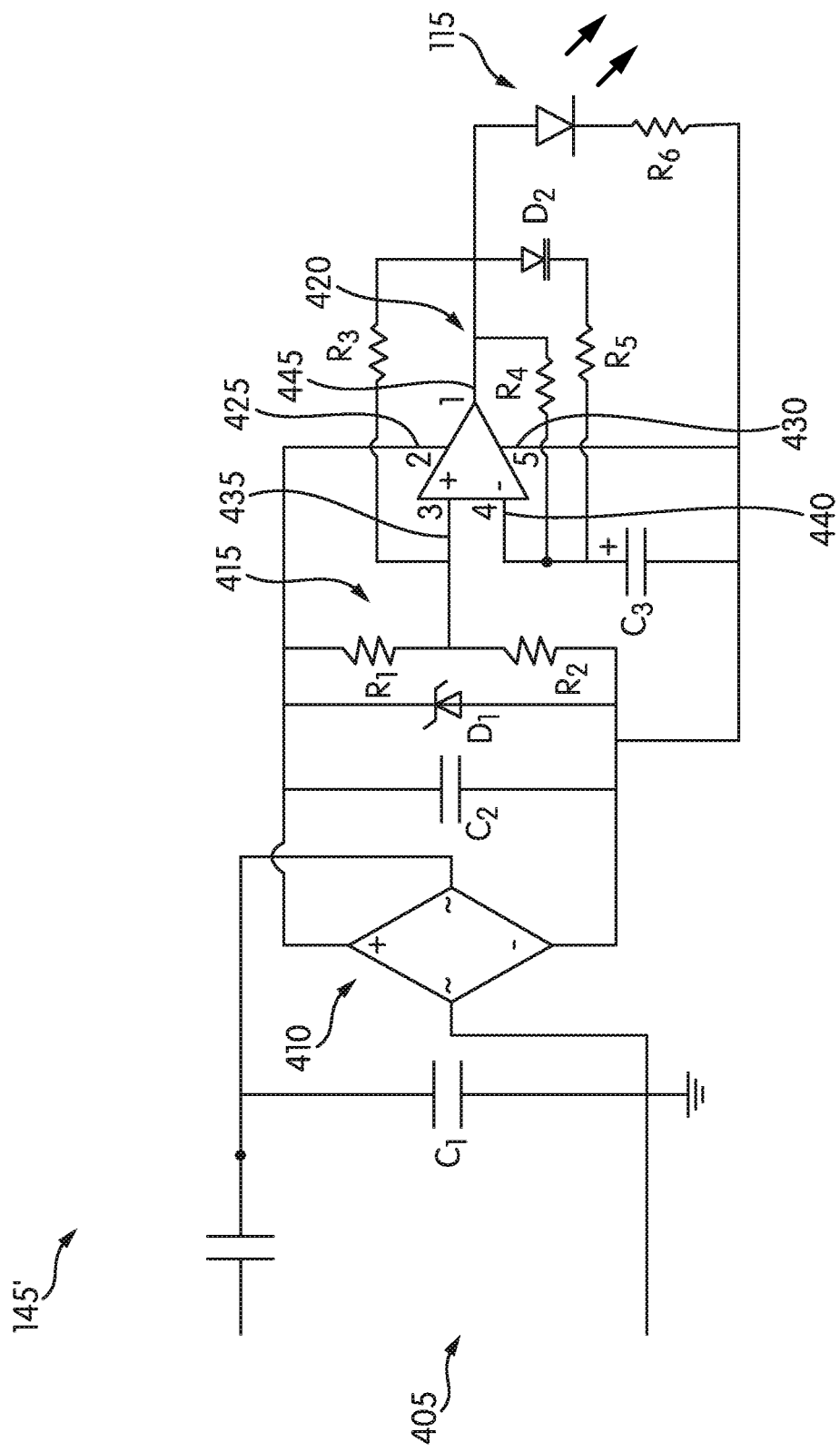
FIG. 4 is a circuit diagram illustrating a testing circuit to be used in accordance with the connector of FIG. 1, according to another embodiment of the application.

FIG. 4 is a circuit diagram illustrating a testing circuit 145' according to another embodiment of the application. he testing circuit 145' may include an test input 405, a capacitor C1, and a rectifier 410. The capacitor C1 and the rectifier 410 receive an alternating-current (AC) voltage from the test input 405 and rectify the AC voltage to a direct-current (DC) voltage. In some embodiments, capacitor C1 has a capacitance of approximately 2500 pF to approximately 3500 pF and a power rating of approximately 0.75 kV to 1.25 kV.

The testing circuit 145' may further include a capacitor C2, a voltage divider 415, a comparator 420, and the indicator 115. In some embodiments, capacitor C2 has a capacitance of approximately 8 μF to approximately 12 μF and a power rating of approximately 45V to approximately 45V The capacitor C2 receives and is charged by the rectified DC voltage output from the rectifier 410. The voltage divider 415 is connected in a parallel-type electrical connection with capacitor C2. The voltage divider 415 receives the rectified DC voltage and outputs a reference voltage based on the rectified DC voltage. In some embodiments, such as the embodiment illustrated in FIG. 4, the voltage divider 415 includes a zener diode D1, a first resistor R1, and a second resistor R2. In some embodiments, zener diode D1 is a IN4738A zener diode. In some embodiments, the first resistor R1 and the second resistor R2 have resistance values of approximately 5 MΩ.

The comparator 420 is a voltage comparator having a source 425, a ground 430, a first input 435, a second input 440, and an output 445. In some embodiments, as illustrated in FIG. 4, the comparator 420 additionally includes a diode D2, a capacitor C3 and resistors R3, R4, and R5. The diode D2, capacitor C3, and resistors R3, R4, and R5 are used to set a predetermined threshold voltage at the second input 440. In some embodiments, diode D2 is a IN4148 high-speed diode. In some embodiments, capacitor C3 has a capacitance of approximately 0.1 μF to approximately 1.2 μF and a power rating of approximately 45V to approximately 45V. In some embodiments, resistor R3 has a resistance value of approximately 2.2 MΩ, resistor R4 has a resistance value of approximately 10 MΩ, and resistor R5 has a resistance value of approximately 33 KΩ.

In operation, the comparator 420 compares the reference voltage received at the first input 435 and the predetermined threshold voltage received at the second input 440. If the reference voltage is greater than the predetermined threshold voltage, the comparator 420 outputs an indicator voltage to power the indicator 115. If the input voltage is not greater than the predetermined threshold voltage, the comparator 420 does not output the indicator voltage to the indicator 115. While the indicator 115 is receiving the indicator voltage, the voltage level of capacitor C2 is dropping. When the voltage of capacitor C2 drops, the reference voltage drops below the predetermined threshold voltage and the comparator stops outputting the indicator voltage to the indicator 115. As long as a voltage is present at the test input 405, the operation is continually repeated, thus causing a blinking effect on the indicator 115.

Figure 5:
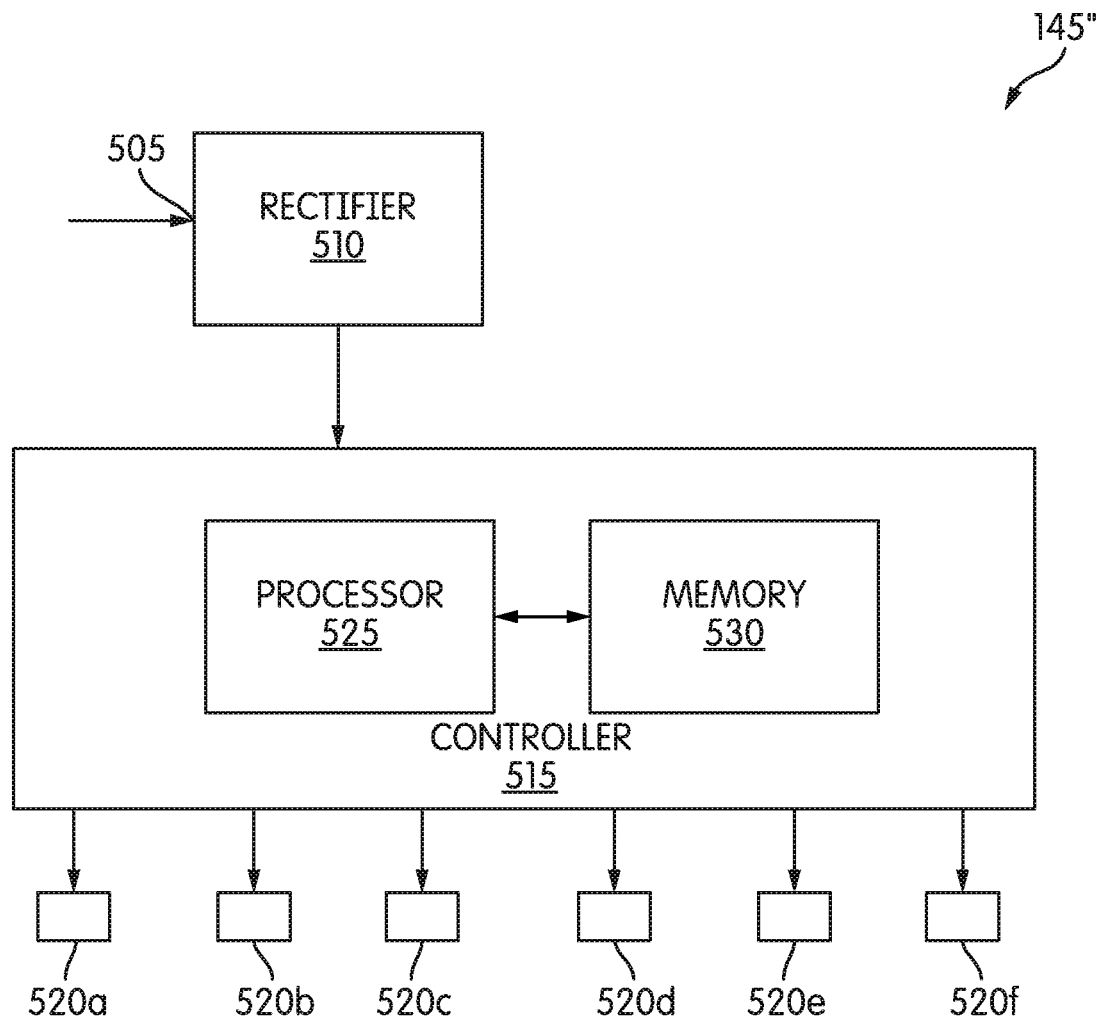
FIG. 5 is a block diagram illustrating a testing circuit to be used in accordance with the connector of FIG. 1, according to another embodiment of the application.

FIG. 5 is a block diagram illustrating a testing circuit 145" according to another embodiment of the application. The testing circuit 145" may include an input 505, a rectifier 510, a controller 515, and one or more of indicators (e.g., indicators 520a, 520b, 520c, 520d, 520e, and 520f). The input 505 receives an AC voltage. The AC voltage is rectified, by the rectifier 510, in to a DC voltage.

The controller 515 is powered by, and measures, the rectified DC voltage. According to one or more exemplary embodiments, controller 515 includes a plurality of electrical and electronic components that provide power, operational control, and protection to the components and modules within the controller 515. For example, the controller 515 includes, among other things, a processor 525 (e.g., a microprocessor, a microcontroller, or another suitable programmable device), a memory 530, input units and output units. In some embodiments, the controller 515 is implemented partially or entirely on a semiconductor (e.g., a field-programmable gate array ["FPGA"] semiconductor) chip, such as a chip developed through a register transfer level ("RTL") design process.

The memory 530 includes, for example, a program storage area and a data storage area. The program storage area and the data storage area can include combinations of different types of memory 530, such as read-only memory 530 ("ROM"), random access memory 530 ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processor 525 is connected to the memory 530 and executes software instructions that are capable of being stored in a RAM of the memory (e.g., during execution), a ROM of the memory (e.g., on a generally permanent basis), or another non-transitory computer readable medium such as another memory or a disc. Software included in the implementation of the testing circuit 145" can be stored in the memory 530 of the controller 515. The software includes, for example, firmware, one or more applications, program data, filters, rules, one or more program modules, and other executable instructions. The controller 515 is configured to retrieve from memory 530 and execute, among other things, instructions related to the control processes and methods described herein. In other constructions, the controller 515 includes additional, fewer, or different components.

The controller 515 outputs operating, or control, signals to the plurality of indicators 520a, 520b, 520c, 520d, 520e, and 520f based on the measured rectified DC voltage. In some embodiments, the controller 515 outputs operating signals based on the measured rectified DC voltage being within varying voltage ranges. For example, in such an embodiment, a first range is approximately 0V-2.5 kV, a second range is approximately 2.6 kV-5 kV, a third range is approximately 5.1 kV-7.5 kV, a fourth range is approximately 7.6 kV-10 kV, a fifth range is approximately 10.1 kV-12.5 kV, and a sixth range is approximately 12.6 kV-15 kV. In other embodiments, there may be more or less indicators and ranges.

In some embodiments, indicator 520a is turned on when the voltage is within the first range, while indicators 520b, 520c, 520d, 520e, and 520f remain off; indicators 520a and 520b are turned on when the voltage is within the second range, while indicators 520c, 520d, 520e, and 520f remain off; indicators 520a, 520b, and 520c are turned on when the voltage is within the third range, while indicators 520d, 520e, and 520f remain off; indicators 520a, 520b, 520c, and 520d are turned on when the voltage is within the fourth range, while indicators 520e, and 520f remain off; indicators 520a, 520b, 520c, 520d, and 520e are turned on when the voltage is within the fifth range, while indicator 520f remains off; and indicators 520a, 520b, 520c, 520d, 520e, and 520f are turned on when the voltage is within the sixth range.

In other embodiments, indicators 520a, 520b, 520c, 520d, and 520e vary in colors. In such an embodiment, indicator 520a is turned on when the voltage is within the first range, while indicators 520b, 520c, 520d, 520e, and 520f remain off; indicator 520b is turned on when the voltage is within the second range, while indicators 520a, 520c, 520d, 520e, and 520f remain off; indicator 520c is turned on when the voltage is within the third range, while indicators 520a, 520b, 520d, 520e, and 520f remain off; indicator 520d is turned on when the voltage is within the fourth range, while indicators 520a, 520b, 520c, 520e, and 520f remain off; indicator 520e is turned on when the voltage is within the fifth range, while indicators 520a, 520b, 520c, 520d, and 520f remain off; and indicator 520f is turned on when the voltage is within the sixth range, while indicators 520a, 520b, 520c, 520d, and 520e remain off.

Figure 6:
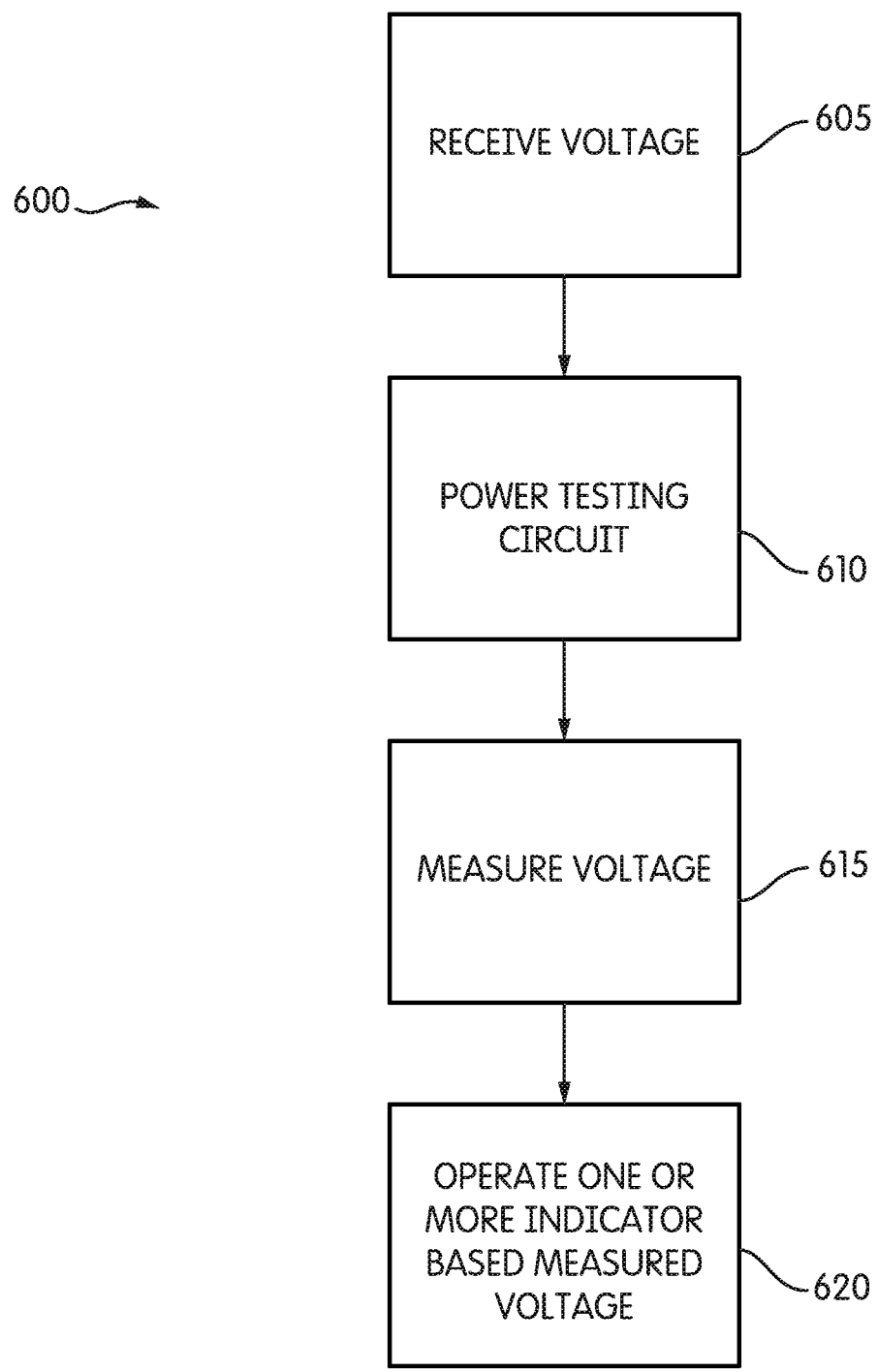
FIG. 6 is a flowchart illustrating an operation of the testing circuit of FIG. 5 according some embodiments of the application.

FIG. 6 is a flowchart illustrating a process, or operation, 600 of the testing circuit 145". It should be understood that the order of the steps disclosed in process 600 could vary. Furthermore, additional steps may be added to the control sequence and not all of the steps may be required. The testing circuit 145" receives a voltage at input 505 (Step 605). The testing circuit 145" is powered by the voltage (Step 610). The testing circuit 145" measures the voltage (Step 615). The testing circuit 145" operates the one or more indicators (e.g., indicators 520a, 520b, 520c, 520d, 520e, and 520f) based on the measured voltage (Step 620).

The phrase "series-type configuration" as used herein refers to a circuit arrangement where the described elements are arranged, in general, in a sequential fashion such that the output of one element is coupled to the input of another, but the same current may not pass through each element. For example, in a "series-type configuration," it is possible for additional circuit elements to be connected in parallel with one or more of the elements in the "series-type configuration." Furthermore, additional circuit elements can be connected at nodes in the series-type configuration such that branches in the circuit are present. Therefore, elements in a series-type configuration do not necessarily form a true "series circuit."

Additionally, the phrase "parallel-type configuration" as used herein refers to a circuit arrangement where the described elements are arranged, in general, in a manner such that one element is connected to another element, such that the circuit forms a parallel branch of the circuit arrangement. In such a configuration, the individual elements of the circuit may not have the same potential difference across them individually. For example, in a parallel-type configuration of the circuit it is possible for two circuit elements that are in parallel with one another to be connected in series with one or more additional elements of the circuit. Therefore, a circuit in a "parallel-type configuration" can include elements that do not necessarily individually form a true parallel circuit.

Thus, the application provides, among other things, a testing circuit for use in accordance with a dead front connector. Various features and advantages of the application are set forth in the following claims.

What is claimed is:

1. A dead front connector comprising:
   an electrical coupling configured to electrically connect a power cable to a device;
   a first indicator and a second indicator; and
   a voltage testing circuit configured to test a voltage between the power cable and the device, the voltage testing circuit including a controller powered by the voltage, the controller configured to measure the voltage and cause illumination of the first indicator when the voltage is within a first voltage range and to cause illumination of the second indicator when the voltage is within a second voltage range.

2. The dead front connector of claim 1, further comprising an insulation layer.

3. The dead front connector of claim 1, further comprising a conductive shield.

4. The dead front connector of claim 1, further comprising a grounded shield.

5. The dead front connector of claim 1, further comprising a voltage tap.

6. The dead front connector of claim 5, wherein the voltage testing circuit is permanently affixed to the voltage tap.

7. The dead front connector of claim 5, wherein the voltage testing circuit is selectively removable from the voltage tap.

8. The dead front connector of claim 1, wherein the controller is further configured to compare the measured voltage to a predetermined threshold and illuminate at least one selected from the group consisting of the first indicator and the second indicator when the measured voltage is above the predetermined threshold.

9. The dead front connector of claim 8, wherein the controller is further configured to compare the measured voltage to at least one selected from a group consisting of the first voltage range and the second voltage range and output the control signal to at least one selected from the group consisting of the first indicator and the second indicator based on the comparison.

10. The dead front connector of claim 1, wherein the indicator is a light-emitting diode.

\* \* \* \* \*